US010896830B2

(12) United States Patent
Fukushi (10) Patent No.: US 10,896,830 B2
(45) Date of Patent: Jan. 19, 2021

(54) SEPARATING APPARATUS

(71) Applicant: DISCO CORPORATION, Tokyo (JP)

(72) Inventor: Nobuyuki Fukushi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 121 days.

(21) Appl. No.: 16/242,640

(22) Filed: Jan. 8, 2019

(65) Prior Publication Data

US 2019/0214282 A1 Jul. 11, 2019

(30) Foreign Application Priority Data

Jan. 11, 2018 (JP) .................................. 2018-002567

(51) Int. Cl.
| | |
|---|---|
| *G06K 9/00* | (2006.01) |
| *H01L 21/67* | (2006.01) |
| *G06T 7/00* | (2017.01) |
| *H01L 21/683* | (2006.01) |

(52) U.S. Cl.
CPC ...... *H01L 21/67132* (2013.01); *G06T 7/0004* (2013.01); *H01L 21/67253* (2013.01); *H01L 21/67288* (2013.01); *G06T 2207/30148* (2013.01); *H01L 21/6838* (2013.01)

(58) Field of Classification Search
CPC ......... H01L 21/67132; H01L 21/67288; H01L 21/67253; H01L 21/6838; H01L 21/6835; H01L 21/304; H01L 2221/68327; H01L 2221/68386; G06T 2207/30148; G06T 7/0004

See application file for complete search history.

(56) References Cited

U.S. PATENT DOCUMENTS

2014/0332166 A1* 11/2014 Honda ................ H01L 21/6838
156/708
2015/0101758 A1* 4/2015 Honda .............. H01L 21/67092
156/714

FOREIGN PATENT DOCUMENTS

| JP | 2008-051670 | * | 3/2008 | |
| JP | 2014-/063882 | * | 4/2014 | ........... H01L 21/304 |
| JP | 2014063882 A | | 4/2014 | |

* cited by examiner

*Primary Examiner* — Amara Abdi
(74) *Attorney, Agent, or Firm* — Greer Burns & Crain Ltd.

(57) ABSTRACT

An apparatus that separates a resin layer together with a film from a wafer to which the film is made to adhere with the intermediary of the resin layer formed on one surface and around which a protruding part is formed through protrusion of the film from a peripheral edge includes a separating unit that separates the resin layer from the one surface of the wafer. An imaging unit images the one surface from which the resin layer has been separated. A first determining part determines whether or not a resin residual in one pixel of a captured image exists based on the brightness of the one pixel, and a second determining part determines whether or not a resin residual that adversely affects grinding exists from the captured image after the first determining part has determined whether or not a resin residual exists in each pixel.

2 Claims, 7 Drawing Sheets

SEPARATING APPARATUS

BACKGROUND OF THE INVENTION

Field of the Invention

The present invention relates to a separating apparatus that separates a protective member from a wafer.

Description of the Related Art

In the case of fabricating a wafer having flat surfaces in a manufacturing process of a semiconductor wafer, for example, an ingot that is composed of a raw material such as silicon and has a circular column shape is thinly cut by a wire saw or the like to obtain a wafer with a circular disc shape. Undulations exist in both surfaces of this circular-disc-shaped wafer in many cases. Thus, grinding processing for the cut-out wafer is carried out. That is, the cut surfaces made by the wire saw in the wafer are ground, and the undulation of the cut surfaces is removed to turn the cut surfaces into flat surfaces.

Figure 9:
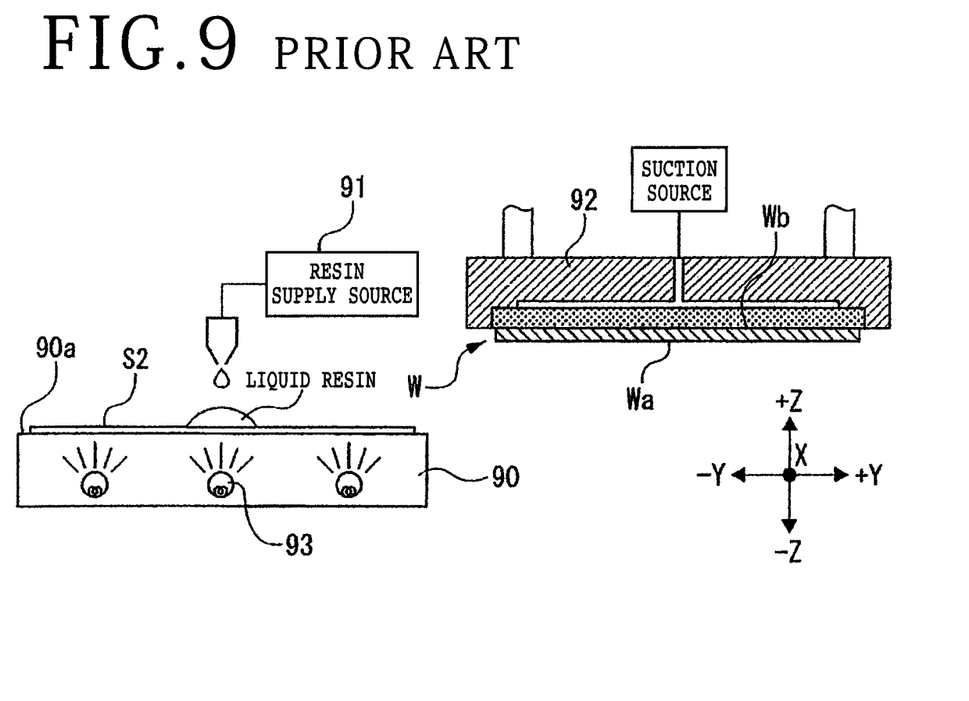
FIG. 9 is a sectional view for explaining the state in which a resin layer is being formed on one surface of a wafer by a liquid resin.
Figure 10:
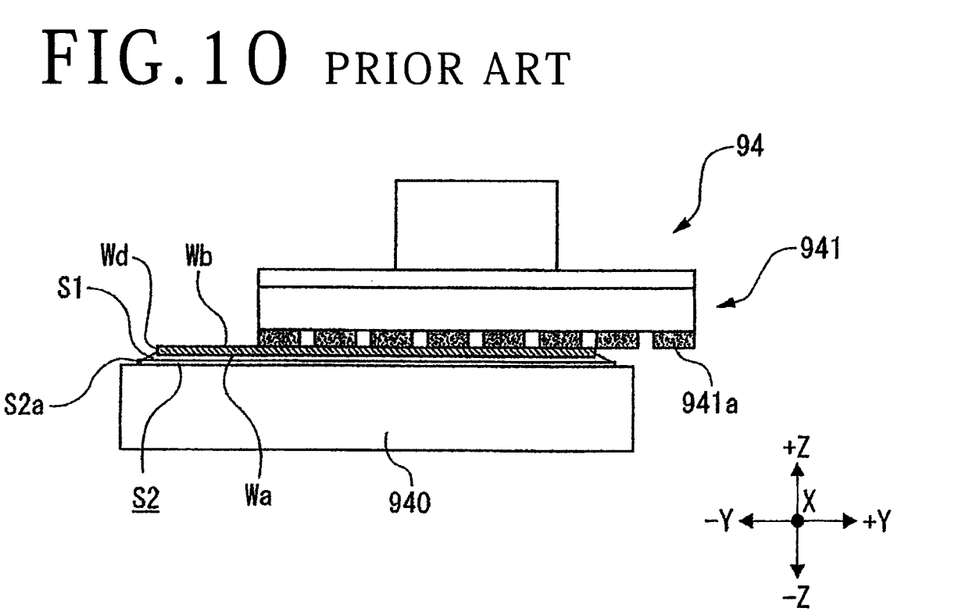
FIG. 10 is a sectional view depicting the state in which the other surface of the wafer is being ground while the resin layer side is held.

In carrying out the grinding processing, for example, as depicted in FIG. 9, a resin layer S1 is formed by a liquid resin on the whole of one surface Wa of a wafer W with a circular disc shape. For this purpose, first, a circular film S2 with a larger diameter than the diameter of the wafer W is placed on a flat holding surface 90a of a holding table 90 of a resin layer formed apparatus, and a predetermined amount of resin in a liquid state is supplied from a resin supplying apparatus 91 onto this film S2. This liquid resin has a property of being cured by ultraviolet irradiation for example. Then, the other surface Wb of the wafer W is sucked and held by holding means 92, and the wafer W is pressed against the liquid resin from the upper side over the film S2 disposed opposed to the one surface Wa of the wafer W. Thereby, the liquid resin is pushed and spread to make a state in which the whole of the one surface Wa is covered by the liquid resin. Subsequently, for example, the covering liquid resin is irradiated with an ultraviolet ray from an ultraviolet irradiation mechanism 93 disposed inside the holding table 90 to cure the resin layer. As a result, as depicted in FIG. 10, the wafer W becomes the state in which the film S2 is made to adhere to the wafer W with the intermediary of the resin layer S1 formed on the whole of the one surface Wa of the wafer W. Furthermore, a protruding part S2a made through protrusion of the film S2 from a peripheral edge Wd of the wafer W is formed.

Then, as depicted in FIG. 10, the wafer W is placed on a holding surface of a chuck table 940 of a grinding apparatus 94, with the film S2 set on the lower side. Then, a grinding wheel 941 is lowered from the upper side of the wafer W, and grinding is carried out while grinding abrasives 941a that rotate are made to abut against the other surface Wb of the wafer W. Thereafter, the resin layer S1 is separated together with the film S2 from the wafer W by the separating apparatus (for example, refer to Japanese Patent Laid-open No. 2014-063882), and then the one surface Wa of the wafer W protected by the resin layer S1 is ground. Thereby, the wafer W whose both surfaces are flat surfaces can be fabricated.

SUMMARY OF THE INVENTION

However, when the resin layer S1 is separated by the separating apparatus, the resin layer S1 is left on the one surface Wa of the wafer W in some cases. If a resin residual exists on the one surface Wa of the wafer W, when the one surface Wa of the wafer W is ground, the remaining resin adheres to the grinding surfaces (lower surfaces) of the grinding abrasives 941a and causes grinding failure in some cases.

Thus, an object of the present invention is to provide the separating apparatus that allows determination of whether or not a resin residual that becomes a cause of grinding failure exists on the wafer W from which a resin layer has been separated in the case of separating the resin layer together with a film from the wafer.

In accordance with an aspect of the present invention, there is provided a separating apparatus that separates a resin layer together with a film from a wafer to which the film is made to adhere with the intermediary of the resin layer formed on one surface of the wafer, and around which a protruding part is formed through protrusion of the film from a peripheral edge of the wafer while grasping the protruding part. The separating apparatus includes holding means having a holding surface that holds the other surface of the wafer, grasping means that grasps the protruding part of the wafer held by the holding means, and separating means that moves the grasping means relative to the holding means in the radial direction from the peripheral edge of the wafer toward the center to separate the resin layer from the one surface of the wafer. The separating apparatus includes also an imaging unit that images the one surface of the wafer from which the resin layer has been separated, a first determining part that determines whether or not a resin residual exists in one pixel of a captured image obtained by imaging by the imaging unit based on brightness of the one pixel, and a second determining part that determines whether or not a resin residual that adversely affects grinding exists from the captured image after the first determining part has determined whether or not a resin residual exists in each one pixel of the captured image.

Preferably, the second determining part determines that a resin residual having an adverse effect in grinding exists when the ratio between an area obtained by summing up pixels about which the first determining part has determined that a resin residual exits and the area of the one surface of the wafer is equal to or higher than a ratio set in advance.

Preferably, the second determining part determines that a resin residual having an adverse effect in grinding exists if determining that a pixel adjacent to a pixel about which the first determining part has determined that a resin residual exists also has a resin residual.

According to the present invention, after the first determining part has determined whether or not a resin residual exists in each one pixel of the captured image, the second determining part determines whether or not a resin residual that adversely affects grinding exists from the captured image. This can avoid the adherence of the residual of the resin layer that adversely affects grinding to the grinding surfaces of grinding abrasives when the one surface of the wafer is ground, and prevent the occurrence of grinding failure.

The second determining part determines that a resin residual having an adverse effect in grinding exists when the ratio between the area obtained by summing up the pixels about which the first determining part has determined that a resin residual exits and the area of the one surface of the wafer is equal to or higher than the ratio set in advance. This can avoid the adherence of the resin residual that adversely affects grinding to the grinding surfaces of grinding abrasives and prevent the occurrence of grinding failure.

The second determining part determines that a resin residual with such a size as to have an adverse effect in grinding exists if determining that a pixel adjacent to a pixel about which the first determining part has determined that a resin residual exists also has a resin residual. This can avoid the adherence of the resin residual that adversely affects grinding to the grinding surfaces of grinding abrasives and prevent the occurrence of grinding failure.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
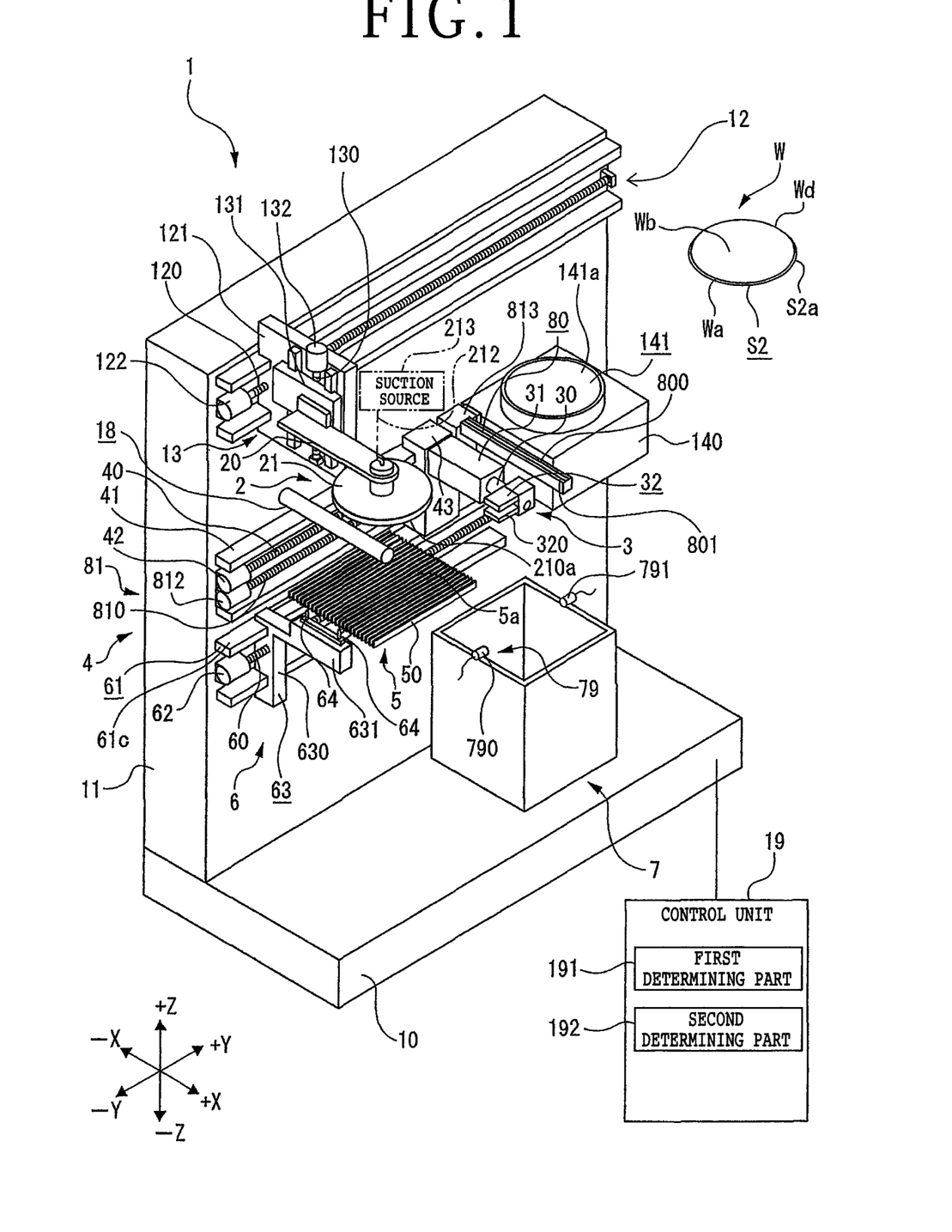
FIG. 1 is a perspective view depicting one example of a separating apparatus.

A separating apparatus 1 depicted in FIG. 1 is apparatus that separates a resin layer S1 (see FIG. 2) together with a film S2 from one surface Wa of a wafer W. The film S2 is formed with a larger diameter than the wafer W and is made to adhere to the one surface Wa (lower surface in FIG. 1) of the wafer W with the intermediary of the resin layer S1. The film S2 has a protruding part S2a that protrudes toward the peripheral side from a peripheral edge Wd of the wafer W.

A column 11 is disposed upright on the rear side (−X direction side) on a rectangular base 10 of the separating apparatus 1. At the upper part of the front surface of the column 11, Y-axis direction movement means 12 that reciprocates holding means 2 disposed over a movable plate 121 in a Y-axis direction by revolving a ball screw 120 whose axial direction is the Y-axis direction by a motor 122 is disposed.

Z-axis direction movement means 13 that reciprocates the holding means 2 in a Z-axis direction is disposed on the movable plate 121. The Z-axis direction movement means 13 reciprocates the holding means 2 disposed on a movable plate 131 in the Z-axis direction by revolving a ball screw 130 whose axial direction is the Z-axis direction by a motor 132.

The holding means 2 includes an arm part 20 whose one end on the −X direction side is fixed onto the movable plate 131, and a holding pad 21 that is disposed on the lower surface of another end of the arm part 20 on the +X direction side and sucks and holds the wafer W. The circular-disc-shaped holding pad 21 depicted in FIG. 2 includes a suction adhesion part 210 that is formed of a porous member and causes suction adhesion of the wafer W, and a frame body 211 that supports the suction adhesion part 210. The suction adhesion part 210 communicates with a suction source 213 such as vacuum generating apparatus through a suction tube 212. Furthermore, a suction force produced through actuation of the suction source 213 is transmitted to a holding surface 210a that is an exposed surface of the suction adhesion part 210, and thereby the holding means 2 sucks and holds the other surface Wb of the wafer W by the holding surface 210a.

At positions that are at the middle part of the front surface of the column 11 depicted in FIG. 1 and are below the movement path of the holding means 2, the following components are disposed to be lined up sequentially from the +Z direction side: a rotating roller 18 having the axial center along the X-axis direction; separating means 4 that separates the resin layer S1 from the wafer W; imaging unit movement means 81 that moves an imaging unit 80 that images the one surface Wa of the wafer W from which the resin layer S1 has been separated; a placement table 5 on which the resin layer S1 separated together with the film S2 from the wafer W is placed; and dropping means 6 that drops the resin layer S1 on the placement table 5. Furthermore, near the +Y direction side of the separating means 4, a table holding pedestal 140 is disposed to protrude on the front surface of the column 11 and a transfer table 141 on which the wafer W after grinding of the other surface Wb is placed is disposed on the table holding pedestal 140. The transfer table 141 can suck and hold the wafer W placed on a holding surface 141a thereof.

The separating means 4 is composed of a ball screw 40 having the axial center along the Y-axis direction, a pair of guide rails 41 disposed in parallel to the ball screw 40, a motor 42 that revolves the ball screw 40, and a movable block 43 that internally has a nut screwed to the ball screw 40 and has a side part in sliding contact with the guide rails 41. Furthermore, when the motor 42 revolves the ball screw 40, the movable block 43 moves in the Y-axis direction in association with this while being guided by the guide rails 41, so that grasping means 3 disposed on the movable block 43 moves in the Y-axis direction in association with the movement of the movable block 43.

The grasping means 3 that grasps the protruding part S2a of the wafer W held by the holding means 2 includes a spindle 30 whose axial direction is the X-axis direction, a housing 31 that rotatably supports the spindle 30, and a grasping clamp 32 disposed at the tip of the spindle 30 on the +X direction side. The grasping clamp 32 can clamp a grasping target between a pair of grasping plates 320 that can get closer to and further away from each other. The angle of the grasping clamp 32 with respect to the grasping target can be changed through rotation of the spindle 30. For example, the grasping means 3 may be movable in the upward-downward direction on the movable block 43.

The rotating roller 18 extending along the X-axis direction can rotate around the axial center along the X-axis direction. The rotating roller 18 plays a role in preventing breaking of the resin layer S1 that possibly occurs in separation of the resin layer S1 by abutting against the film S2 at the time of the separation. The rotating roller 18 may be movable in the Y-axis direction.

The imaging unit movement means 81 is composed of a ball screw 810 having the axial center along the Y-axis direction, the pair of guide rails 41 disposed in parallel to the ball screw 810, a motor 812 that revolves the ball screw 810, and a movable block 813 that internally has a nut screwed to the ball screw 810 and has a side part in sliding contact with the guide rails 41. Furthermore, when the motor 812 revolves the ball screw 810, the movable block 813 moves in the Y-axis direction in association with this while being guided by the guide rails 41, so that the imaging unit 80 disposed on the movable block 813 moves in the Y-axis direction in association with the movement of the movable block 813.

The imaging unit 80 disposed on the movable block 813 is a line sensor camera for example. The imaging unit 80 includes illumination 801 that irradiates an imaging region, an optical system that is composed of a lens and so forth and captures reflected light from the wafer W and is not depicted in the diagram, and an imaging part 800 that carries out photoelectric conversion of a subject image formed by the optical system and outputs image information. The imaging part 800 is formed by lining up plural light receiving elements of a CCD or the like on one row side by side along the X-axis direction. The length of the imaging part 800 in its longitudinal direction (X-axis direction) is equal to or longer than the diameter of the holding pad 21 forming the holding means 2. Due to this, the imaging part 800 has the imaging region with a length equal to or longer than the diameter of the wafer W. The illumination 801 irradiates the one surface Wa of the wafer W in the state of being held by the holding means 2 and being located above the imaging unit 80 with light with a predetermined light amount. The light with which the irradiation is carried out from the illumination 801 is reflected by the one surface Wa of the wafer W, and the reflected light forms an image on the imaging part 800 opposed to the one surface Wa of the wafer W. Thereby, the imaging unit 80 can image the one surface Wa of the wafer W in a line manner.

For example, the placement table 5 has a rectangular outer shape and the upper surface thereof is a placement surface 5a with a slotted floor shape. Specifically, the placement table 5 has a configuration in which plural straight line materials 50 are juxtaposed in such a manner that the longitudinal direction is set parallel to the Y-axis direction and gaps are formed to keep equal intervals in the X-axis direction and one end of each straight line material 50 on the +Y direction side is joined and fixed by a joining component. For example, the placement 5 is fixed to the front surface of the column 11 by the joining component that joins the respective straight line materials 50.

The dropping means 6 is composed of a ball screw 60 having the axial center along the Y-axis direction, a pair of guide rails 61 disposed in parallel to the ball screw 60, a motor 62 that revolves the ball screw 60, a movable member 63 that internally has a nut screwed to the ball screw 60 and has a side part 630 in sliding contact with the guide rails 61, and sticking pins 64 disposed on the movable member 63.

The movable member 63 includes the side part 630 screwed to the ball screw 60 and a pin pedestal part 631 that protrudes from the upper end of the side part 630 toward the +X direction side for example. On the upper surface of the pin pedestal part 631, e.g. two sticking pins 64 that stick upward are disposed separately by a predetermined distance in the X-axis direction. When the motor 62 revolves the ball screw 60, the movable member 63 moves in the Y-axis direction in association with this while being guided by the guide rails 61, so that the sticking pins 64 on the movable member 63 move in the Y-axis direction in such a manner as to pass through the gaps between the respective straight line materials 50 of the placement table 5.

A box 7 that houses the resin layer S1 separated together with the film S2 is disposed on the base 10. The box 7 is opened upward below the end of the placement table 5 on the +Y direction side for example. At the upper part of the box 7, for example, a transmission-type optical sensor 79 including a light emitting part 790 and a light receiving part 791 is disposed. The resin layer S1 that is separated from the wafer W and is placed on the placement table 5 is dropped into the box 7 by the dropping means 6. The resin layers S1 are piled up to a predetermined height in the box 7, and inspection light between the light emitting part 790 and the light receiving part 791 is blocked by the resin layers S1. This causes the optical sensor 79 to detect that the inside of the box 7 is filled with the resin layers S1.

The separating apparatus 1 includes a control unit 19 that is composed of a CPU and a storing element such as a memory and carries out control of the overall apparatus. The control unit 19 is connected to the separating means 4, the Y-axis direction movement means 12, the imaging unit 80, and so forth by wiring that is not depicted in the diagram. Under control by the control unit 19, movement operation of the holding means 2 in the Y-axis direction by the Y-axis direction movement means 12, movement operation of the grasping means 3 in the Y-axis direction by the separating means 4, and so forth are controlled.

For example, the control unit 19 includes a first determining part 191 that determines whether or not a resin residual exists in one pixel of a captured image obtained by imaging by the imaging unit 80 based on the brightness of the one pixel, and a second determining part 192 that determines whether or not the resin residual that adversely affects grinding exists based on the captured image after the first determining part 191 has determined whether or not the resin residual exists regarding each one pixel of the captured image.

In the following, operation of the separating apparatus 1 in the case of separating the resin layer S1 from the wafer W by the separating apparatus 1 will be described by using FIGS. 1 to 5. In FIGS. 2 to 5, part of the configuration of the separating apparatus 1 is depicted in a simplified manner.

First, as depicted in FIG. 1, the wafer W after the other surface Wb is ground is placed on the transfer table 141, with the other surface Wb set on the upper side. The Y-axis direction movement means 12 moves the holding means 2 in the +Y direction and the holding pad 21 is positioned above the wafer W in such a manner that the center of the holding surface 210a and the center of the other surface Wb of the wafer W substantially correspond with each other. The Z-axis direction movement means 13 lowers the holding means 2, and the holding surface 210a of the holding pad 21 is brought into contact with the other surface Wb of the wafer W. The suction source 213 is actuated, and a produced suction force is transmitted to the holding surface 210a, so that the holding means 2 sucks and holds the wafer W, with the side of the resin layer S1 oriented downward.

Figure 2:
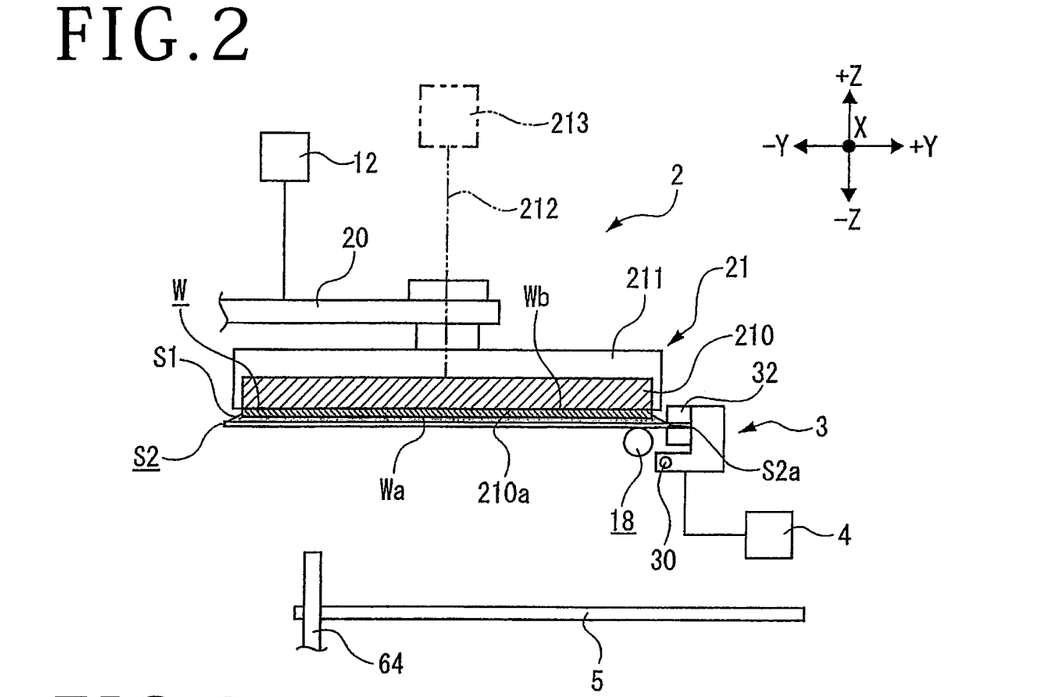
FIG. 2 is a sectional view depicting the state in which a protruding part of a film of a wafer held by holding means is grasped by grasping means.

As depicted in FIG. 2, the holding means 2 that sucks and holds the wafer W moves in the −Y direction until being located above the rotating roller 18 and then lowers in the −Z direction to cause the side surface of the rotating roller 18 to abut against the vicinity of the peripheral part of the lower surface of the film S2 on the +Y direction side. The separating means 4 moves the grasping means 3 in the −Y direction and brings the grasping means 3 close to the peripheral part of the film S2 on the +Y direction side, and the grasping clamp 32 grasps the protruding part S2a.

Figure 3:
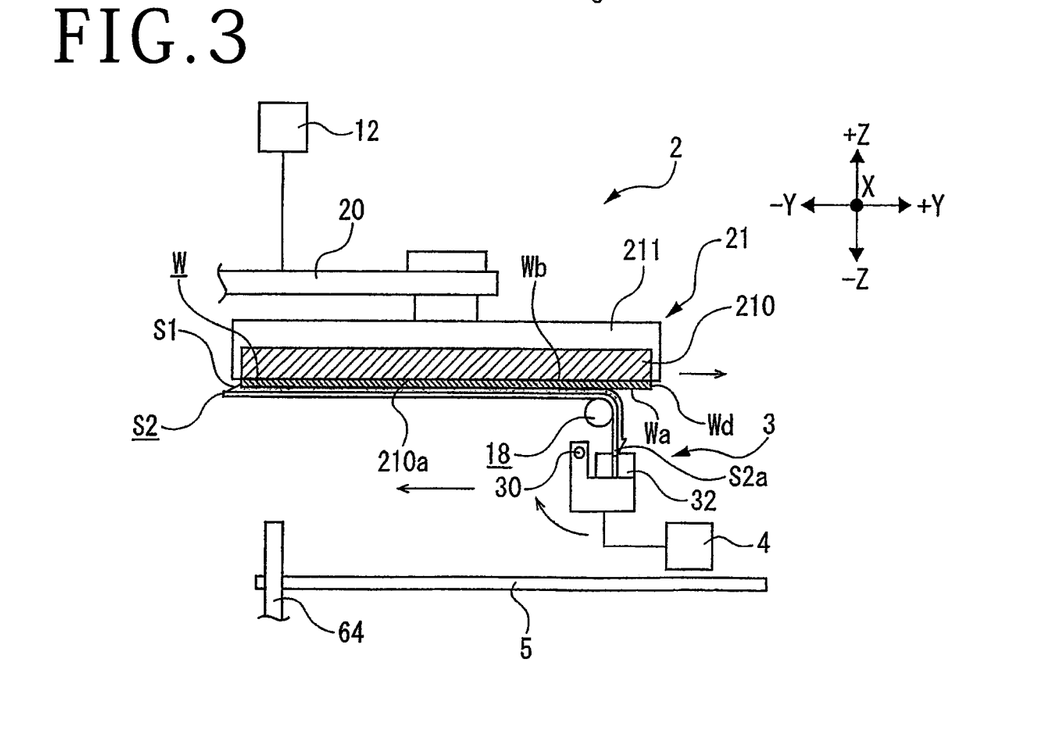
FIG. 3 is a sectional view depicting the state in which a separation of a resin layer has been started through moving the grasping means that grasps the protruding part by separating means and moving the holding means to the opposite side to the separating means in the radial direction.

As depicted in FIG. 3, after the grasping clamp 32 grasps the protruding part S2a, the spindle 30 rotates by 90 degrees in a clockwise direction as viewed from the +X direction side (near side of the plane of paper). Thereby, while the resin layer S1 and the film S2 are gently bent in such a manner as to follow the side surface of the rotating roller 18, the film S2 is pulled toward the −Z direction by the grasping clamp 32. This separates part of the peripheral side of the resin layer S1 from the one surface Wa of the wafer W.

Subsequently, by the separating means 4, the grasping means 3 is moved relative to the holding means 2 in the radial direction from the peripheral edge Wd of the wafer W toward the center to separate the resin layer S1 from the wafer W. Specifically, the grasping means 3 is moved toward the −Y direction side by the separating means 4. In addition, the Y-axis direction movement means 12 moves the holding means 2 toward the +Y direction side for example, and the rotating roller 18 rotates around the axial center along the X-axis direction. Thereby, while the state in which the film S2 and the resin layer S1 are gently bent in such a manner as to follow the side surface of the rotating roller 18 is kept, the resin layer S1 is separated from the peripheral edge Wd of the wafer W on the +Y direction side toward the −Y direction side. Here, if breaking of the resin layer S1 occurs in the separation, an impulsive force is instantaneously applied from the resin layer S1 to the one surface Wa of the wafer W as a reaction attributed to the resin breaking and the one surface Wa of the wafer is scratched in some cases. However, the breaking of the resin layer S1 in the separation can be prevented due to the abutting of the side surface of the rotating roller 18 against the film S2.

Figure 4:
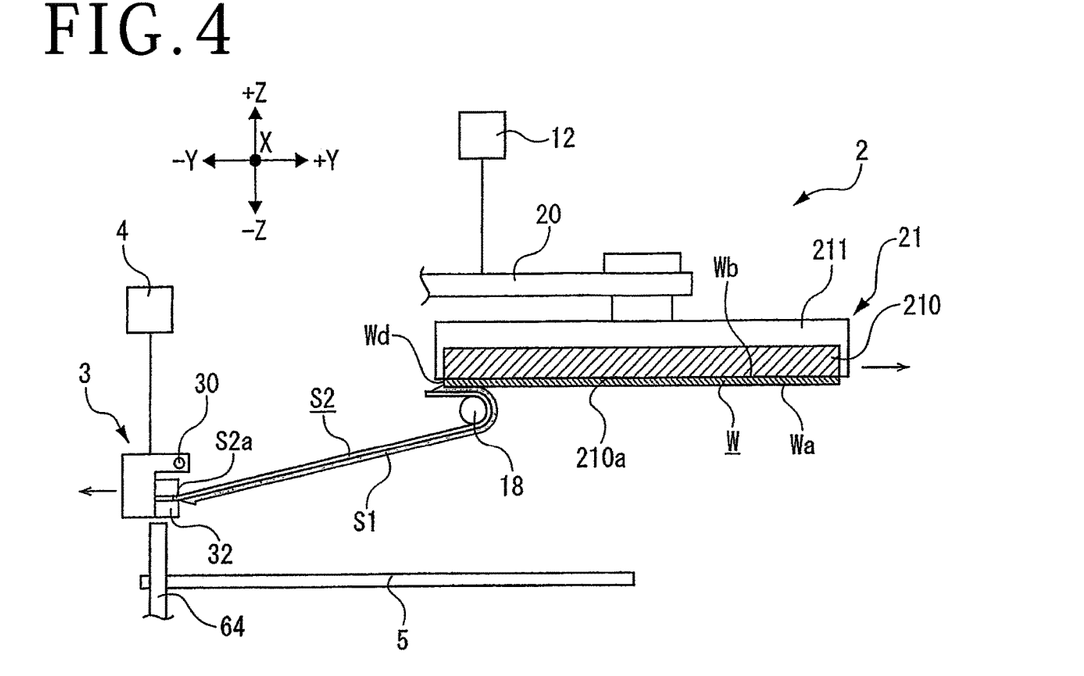
FIG. 4 is a sectional view depicting the state in which a large part of the resin layer has been separated from the wafer through moving the grasping means that grasps the protruding part by the separating means and moving the holding means to the opposite side to the separating means in the radial direction.

As depicted in FIG. 4, when the grasping means 3 moves to the vicinity of the peripheral edge Wd of the wafer W on the −Y direction side, the spindle 30 further rotates by 90 degrees in a clockwise direction as viewed from the +X direction side (near side of the plane of paper), which makes the state in which the resin layer S1 is oriented downward. Moreover, the Y-axis direction movement means 12 moves the holding means 2 toward the +Y direction side, and the separating means 4 moves the grasping means 3 toward the −Y direction side. Thereby, the whole of the resin layer S1 is separated from the wafer W. When the whole of the resin layer S1 is separated from the wafer W, the grasping of the protruding part S2a by the grasping means 3 is released and the film S2 and the resin layer S1 are dropped toward the placement table 5.

It suffices for the separating means 4 to be what moves the grasping means 3 relative to the holding means 2 in the radial direction from the peripheral edge Wd of the wafer W toward the center to separate the resin layer S1 from the wafer W. Therefore, a configuration may be employed in which the grasping means 3 does not move in the Y-axis direction and only the holding means 2 moves in the Y-axis direction to separate the resin layer S1.

Subsequently, the dropping means 6 drops the film S2 and the resin layer S1 from the placement table 5. Specifically, the sticking pins 64 push and move the film S2 and the resin layer S1 toward the +Y direction and drop them from the placement table 5 into the box 7 depicted in FIG. 1 to discard the film S2 and the resin layer S1 in the box 7.

Figure 5:
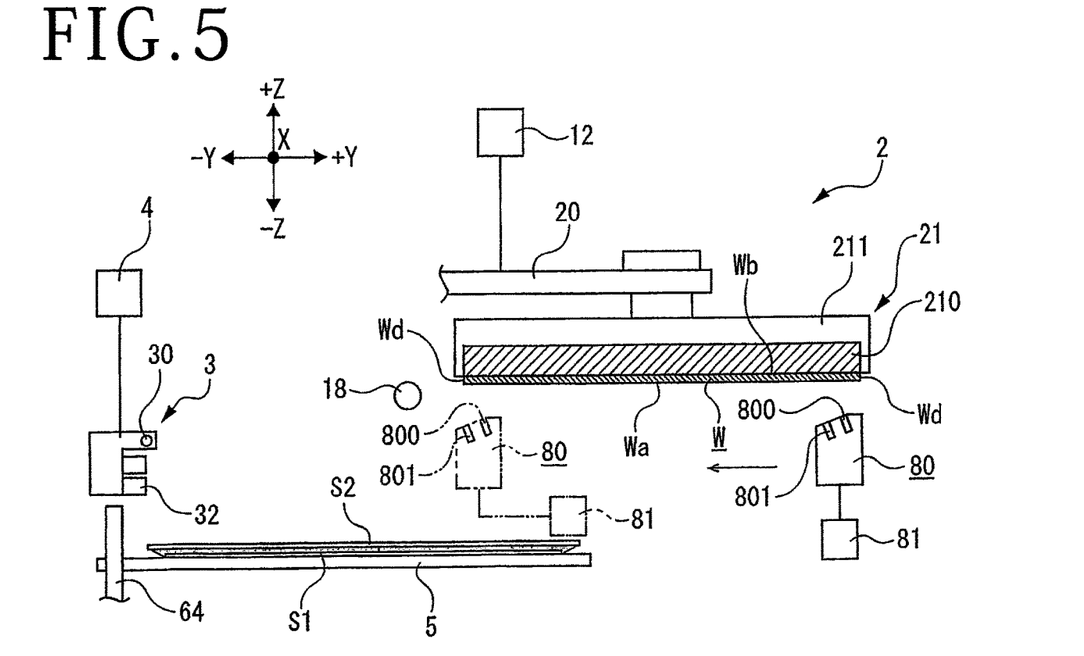
FIG. 5 is a sectional view depicting the state in which one surface of the wafer after the resin layer has been separated is being imaged by an imaging unit.

(1) First Embodiment of Determination of Whether or not Resin Residual on One Surface of Wafer Exists Subsequently, for example, the movement of the grasping means 3 by the separating means 4 and the movement of the holding means 2 by the Y-axis direction movement means 12 are stopped. As depicted in FIG. 5, the imaging unit movement means 81 moves the imaging unit 80 toward the −Y direction side. Thereby, the imaging unit 80 passes below the wafer W held by the holding means 2. In this passing, the one surface Wa of the wafer W is imaged by the imaging part 800 of the imaging unit 80 for each one line consecutively from the peripheral edge Wd of the wafer W on the +Y direction side to the peripheral edge Wd on the −Y direction side. That is, the illumination 801 irradiates the one surface Wa of the wafer W with light, and reflected light from the one surface Wa of the wafer W is incident on each pixel of a CCD of the imaging part 800 through the optical system, which is not depicted in the diagram.

A configuration may be employed in which the one surface Wa of the wafer W from which the resin layer S1 has been separated is imaged by the imaging unit 80 by moving only the holding means 2 in the Y-axis direction without moving the imaging unit 80 in the Y-axis direction. If the holding pad 21 of the holding means 2 rotates around the axial center along the Z-axis direction, the imaging unit 80 may be positioned below the center of the holding means 2, and the one surface Wa of the wafer W may be imaged by the imaging unit 80 while the holding pad 21 is rotated at a predetermined speed.

Image information of each one line of the one surface Wa of the wafer W is sequentially transmitted from the imaging unit 80 to the control unit 19 depicted in FIG. 1. This image information is recorded in a storing part of the control unit 19 in turn to allow forming of the whole image of the one surface Wa of the wafer W. Then, when the imaging unit 80 travels in the −Y direction to a predetermined position in the Y-axis direction at which the imaging unit 80 has completed the passing below the one surface Wa of the wafer W, a captured image obtained by imaging the whole of the one surface Wa of the wafer W is acquired. For example, the captured image is an aggregate of one pixel that has a predetermined size and whose luminance value (index indicating the brightness of one pixel) is represented by a 8-bit grayscale, i.e. 256 gray levels of 0 to 255. The one pixel has less brightness and is closer to black when the luminance value is closer to 0. Furthermore, the one pixel has more brightness and is closer to white when the luminance value is closer to 255.

The luminance value in each one pixel of the formed captured image, i.e. the amount of light incident on each one pixel of the CCD of the imaging part 800, is settled depending on the amount of residual of the resin layer S1 corresponding to the one pixel. Specifically, when the amount of resin residual is larger, the amount of incident light decreases to a larger extent, and the luminance value of the one pixel is closer to 0 and the one pixel is closer to black. When the amount of resin residual is smaller, the amount of incident light increases to a larger extent, and the luminance value of the one pixel is closer to 255 and the one pixel is closer to white.

Figure 6:
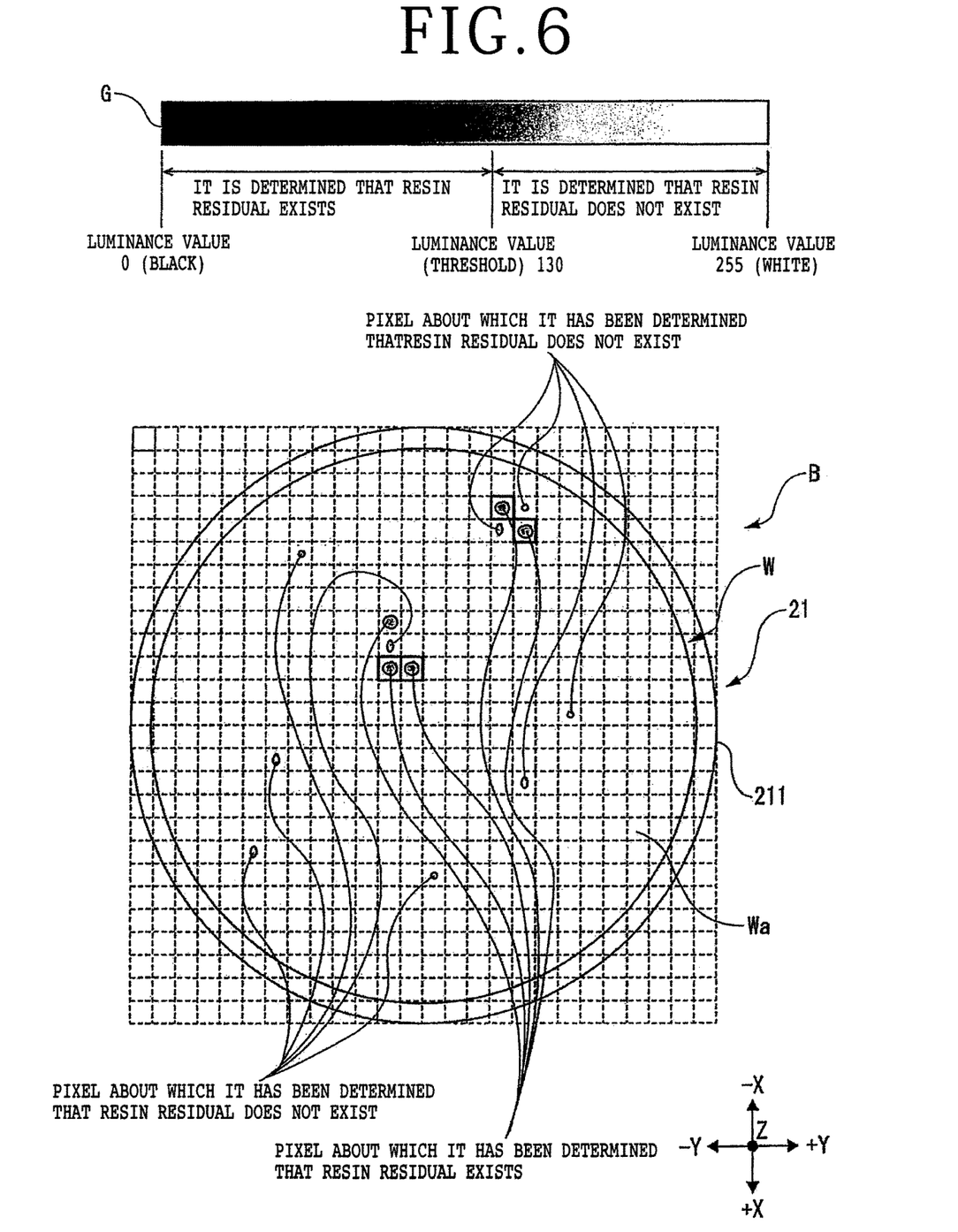
FIG. 6 is an explanatory diagram depicting a captured image in which the whole of the one surface of the wafer after whether or not a resin residual exists has been determined in each one pixel by the first determining part appears.

For example, a luminance value as a threshold (for example luminance value 130 in a grayscale G depicted in FIG. 6) is set in advance in the first determining part 191 of the control unit 19 in order to determine whether or not a resin residual exists in one pixel of a captured image obtained by imaging the whole of the one surface Wa of the wafer W. The first determining part 191 reads the captured image of the whole of the one surface Wa of the wafer W from the storing part of the control unit 19, and compares the luminance value of each one pixel in the captured image and the luminance value 130 as the threshold. Then, the first determining part 191 determines that a resin residual exists about a pixel whose luminance value is equal to or smaller than 130, and determines that a resin residual does not exist about a pixel whose luminance value surpasses 130.

In FIG. 6, a virtual output screen B with a predetermined resolution (for example 640×480 pixels) on an X-axis-Y-axis orthogonal coordinate system is depicted. The captured image in which the whole of the one surface Wa of the wafer W after whether or not a resin residual exists has been determined about each one pixel by the first determining part 191 appears is displayed on the output screen B. Each square of a lattice represented by dashed lines in FIG. 6 represents one pixel. In FIG. 6, regarding each one pixel in the captured image, the luminance value of the pixel is schematically displayed based on the amount of resin residual. For example, in FIG. 6, the pixel about which it has been determined that the luminance value is equal to or smaller than 130 and a resin residual exists by the first determining part 191 is depicted with the grayscale of the luminance value corresponding to the amount of the resin residual (for example luminance value 50) actually. The pixel about which it has been determined that the luminance value surpasses 130 and a resin residual does not exist by the first determining part 191 is depicted with the grayscale of the luminance value corresponding to the amount of the resin residual (for example luminance value 190) actually.

The captured image in which the whole of the one surface Wa of the wafer W after whether or not a resin residual exists has been determined about each one pixel by the first determining part 191 appears may be displayed on the output screen B after furthermore being binarized based on the threshold 130 by the first determining part 191. In this case, regarding the pixel about which it has been determined that the luminance value surpasses 130 and a resin residual does not exist, the luminance value becomes 0 (white) and the pixel is not displayed on the output screen B. Regarding the pixel about which it has been determined that the luminance value is equal to or smaller than 130 and a resin residual exists, the luminance value becomes 255 (black) and the pixel is displayed on the output screen B.

After the first determining part 191 has determined whether or not a resin residual exists about each one pixel of the captured image, the second determining part 192 calculates the sum of the pixels about which the first determining part 191 has determined that a resin residual exists, depicted in FIG. 6, and employs this sum as the total area with the resin residual in the one surface Wa of the wafer W. The second determining part 192 has acquired the value of the area of the one surface Wa of the wafer W as known data in advance. Furthermore, the second determining part 192 calculates the ratio of the total area with the resin residual to the area of the one surface Wa of the wafer W. For example, this calculated ratio is defined as U % in percentage.

In the second determining part 192, a permitted ratio (for example defined as V % in percentage) of the total area with the resin residual to the area of the one surface Wa of the wafer W is set in advance. This ratio set in advance is a ratio selected experimentally, empirically, or theoretically for the purpose of carrying out proper grinding processing for the one surface Wa of the wafer W.

The second determining part 192 compares the ratio U % of the total area with the resin residual to the area of the one surface Wa of the wafer W and the permitted ratio V % set in advance, and determines whether or not the resin residual that adversely affects grinding exists on the one surface Wa of the wafer W.

If U %>V % is satisfied, the second determining part 192 determines that the resin residual having an adverse effect in grinding exists on the one surface Wa of the wafer W, and activates an alarm of this determination by making a warning sound, displaying an error, or the like. For the wafer W about which it has been determined that the resin residual having an adverse effect exists, for example, a worker scrapes off the resin layer S1 remaining on the one surface Wa of the wafer W. Alternatively, the wafer W on which the resin layer S1 remains is conveyed to a protective member forming apparatus or the like again and the resin layer S1 is formed on the one surface Wa of the wafer W again. Then, the resin layer S1 is separated together with the film S2 by the separating apparatus 1 again. Thereby, the remaining resin layer S1 is separated. Then, only the wafer W on which the resin layer S1 does not remain on the one surface Wa of the wafer W is conveyed to a grinding apparatus.

As described above, the separating apparatus 1 according to the present invention includes the holding means 2 having the holding surface 210a that holds the other surface Wb of the wafer W, the grasping means 3 that grasps the protruding part S2a of the wafer W held by the holding means 2, and the separating means 4 that moves the grasping means 3 relative to the holding means 2 in the radial direction from the peripheral edge Wd of the wafer W toward the center to separate the resin layer S1 from the one surface Wa of the wafer W. The separating apparatus 1 includes also the imaging unit 80 that images the one surface Wa of the wafer W from which the resin layer S1 has been separated, and the first determining part 191 that determines whether or not a resin residual exists in one pixel of a captured image obtained by imaging by the imaging unit 80 based on the brightness of the one pixel. After the first determining part 191 has determined whether or not a resin residual exists about each one pixel of the captured image, the second determining part 192 determines whether or not the resin residual that adversely affects grinding exists from the captured image. This can avoid the adherence of the residual of the resin layer S1 that adversely affects grinding to the grinding surfaces of grinding abrasives when the one surface Wa of the wafer W is ground, and prevent the occurrence of grinding failure in later grinding.

When the ratio between the area obtained by summing up the pixels about which the first determining part 191 has determined that a resin residual exists and the area of the one surface Wa of the wafer W is equal to or higher than the ratio set in advance (as one example, when many fine resin residuals exist in a dotted manner in units of pixel on the one surface Wa of the wafer W), the second determining part 192 determines that the resin residual having an adverse effect in grinding exists. This can avoid the adherence of the resin residual that adversely affects grinding to the grinding surfaces of grinding abrasives and prevent the occurrence of grinding failure.

(2) Second Embodiment of Determination of Whether or not Resin Residual on One Surface of Wafer Exists The determination of whether or not the resin residual that adversely affects grinding exists from the captured image by the second determining part 192 after the first determining part 191 has determined whether or not a resin residual exists about each one pixel of the captured image may be carried out as depicted below.

The process to the determination of whether or not a resin residual exists about each one pixel of the captured image by the first determining part 191 is carried out similarly to the first embodiment. Thereafter, the second determining part 192 determines whether or not the respective pixels about which the first determining part 191 has determined that a resin residual exists, depicted in FIG. 6, are adjacent. In the example depicted in FIG. 6, the second determining part 192 determines that pixels with a resin residual (two pixels represented by solid lines) are adjacent in the Y-axis direction, and determines that pixels with a resin residual (two pixels represented by solid lines) are adjacent in an oblique direction. So, the second determining part 192 determines that a resin residual with such a size as to have an adverse effect in grinding exists, and activates an alarm of this determination. As a result, scraping or the like of the resin residual is carried out for the wafer W, and the resin residual that adversely affects grinding is kept from adhering to the grinding surfaces of grinding abrasives, so that it becomes possible to prevent the occurrence of grinding failure.

On the other hand, if determining that adjacent pixels do not exist in the respective pixels about which it has been determined that a resin residual exists, the second determining part 192 determines that the resin residual with such a size as to have an adverse effect in grinding does not exist, and the wafer W is conveyed to the grinding apparatus.

The respective configurations of the separating apparatus 1 according to the present invention are not limited to the configurations depicted in FIG. 1. Furthermore, the embodiments of the determination of whether or not a resin residual on the one surface Wa of the wafer W exists are also not limited to the above-described first embodiment and second embodiment and can be changed as appropriate within a range in which effects of the present invention can be exerted. For example, the second determining part 192 may further carry out the determination of whether or not a resin residual on one surface of a wafer exists in the second embodiment after carrying out the determination of whether or not a resin residual on the one surface of the wafer exists in the first embodiment.

For example, in (2) second embodiment of determination of whether or not resin residual on one surface of wafer exists, the second determining part 192 may carry out the determination of whether or not the resin residual having an adverse effect in grinding exists in the following manner in consideration of the positional relationship between the one surface Wa of the wafer W and the locus of grinding abrasives at the time of grinding.

Figure 7:
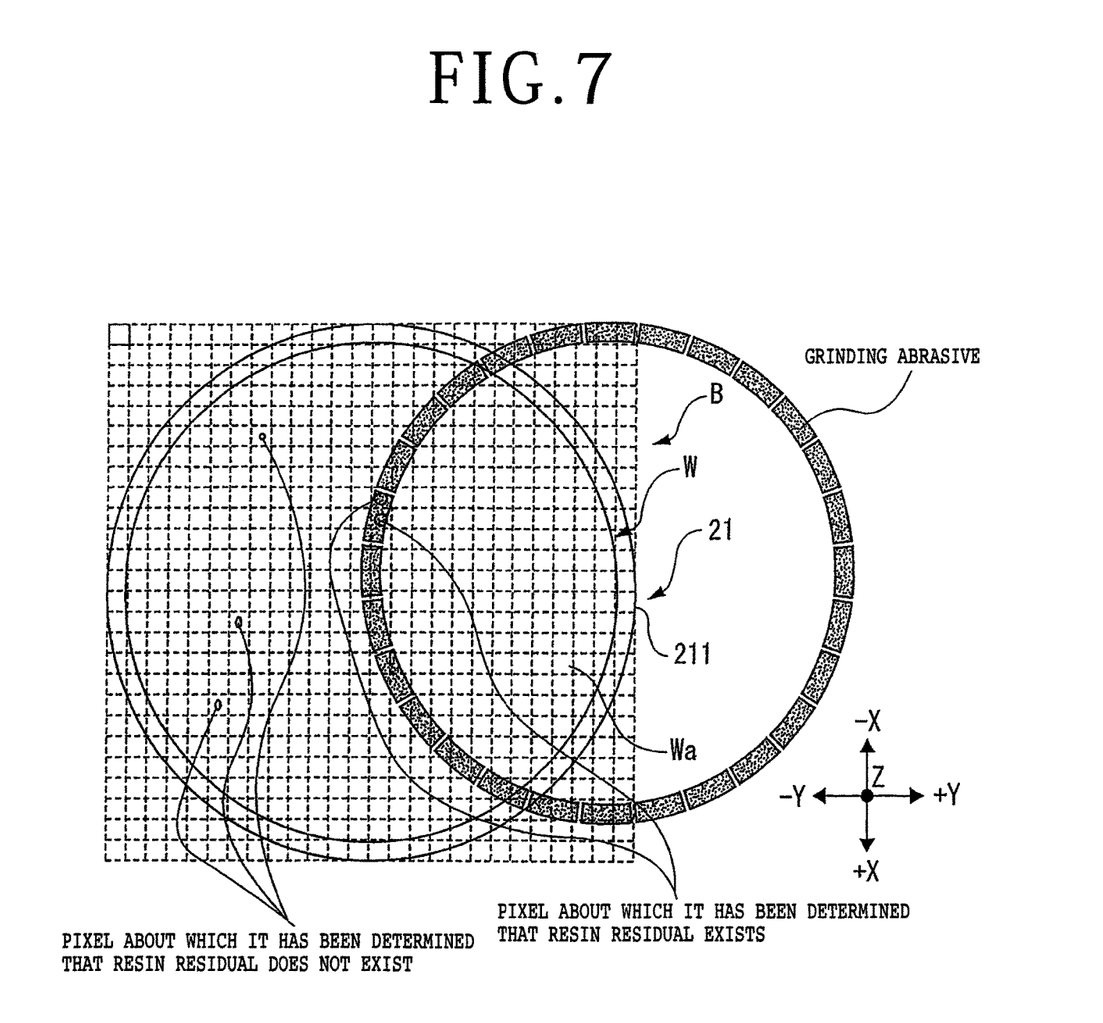
FIG. 7 is an explanatory diagram for explaining the case in which, when determining that adjacent pixels with a resin residual exist, the second determining part determines that a resin residual having an adverse effect in grinding exists in consideration of the rotation locus of grinding abrasives at the time of grinding.

In the case of grinding the one surface Wa of the wafer W by grinding abrasives later, for example as depicted in FIG. 7, the center of rotation of the grinding abrasives is shifted in the horizontal plane direction by a predetermined distance relative to the center of the one surface Wa of the wafer W, and positioning is carried out in such a manner that the rotation locus of the grinding abrasives passes through the center of rotation of the one surface Wa of the wafer W. The second determining part 192 of the separating apparatus 1 grasps the positional relationship between the rotation locus of these grinding abrasives and the one surface Wa of the wafer in advance. Furthermore, concurrently with carrying out the determination of whether or not the respective pixels about which the first determining part 191 has determined that a resin residual exists are adjacent, the second determining part 192 carries out determination of what shape the respective pixels determined to have a resin residual and be adjacent are adjacent in on the rotation locus of the grinding abrasives.

Figure 8:
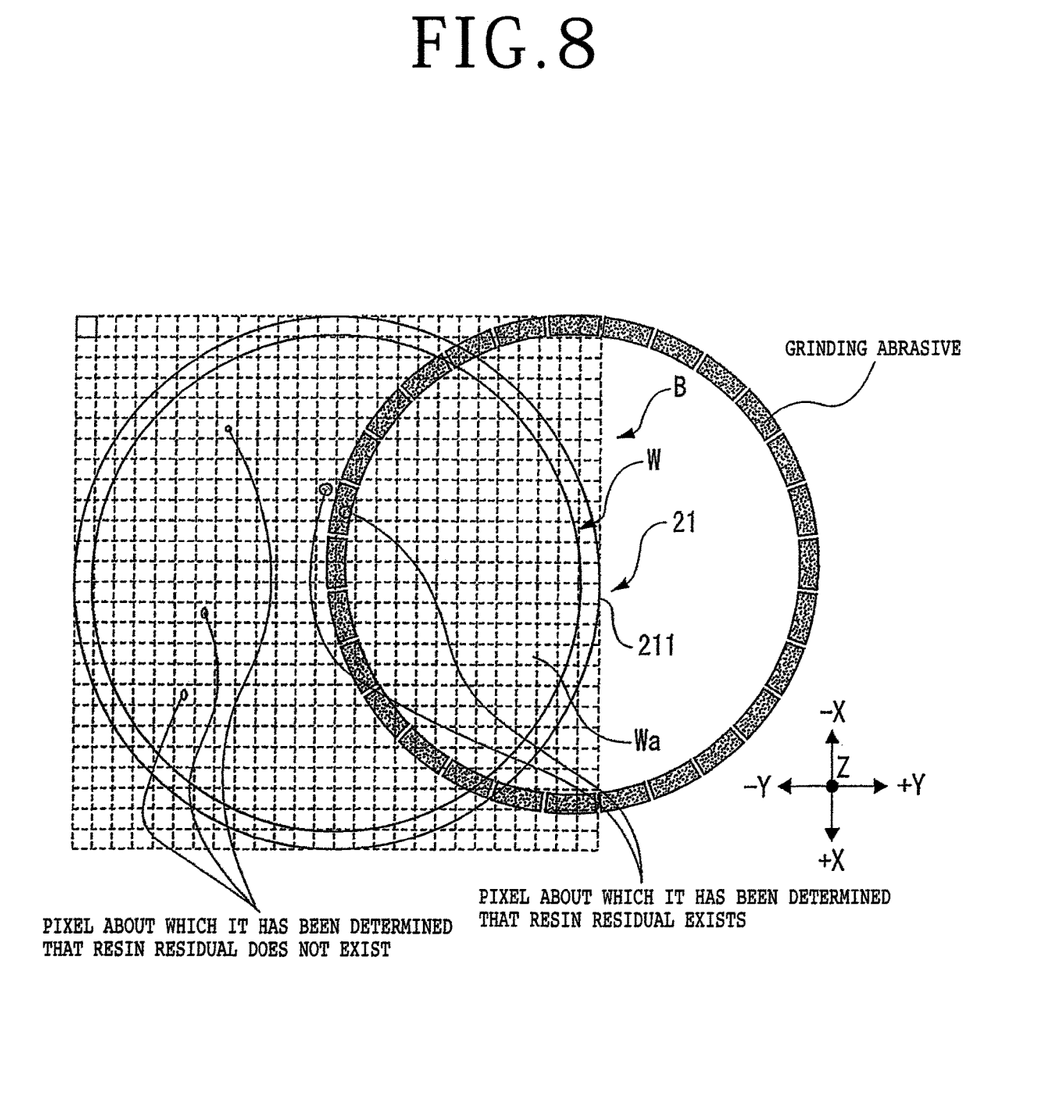
FIG. 8 is an explanatory diagram for explaining the case in which, when determining that adjacent pixels with a resin residual exist, the second determining part determines that a resin residual having an adverse effect in grinding does not exist in consideration of the rotation locus of the grinding abrasives at the time of grinding.

As depicted in FIG. 7, if pixels with a resin residual are adjacent in the X-axis direction along the rotation locus of the grinding abrasives, the second determining part 192 determines that a resin residual with such a size as to have an adverse effect through consecutively adhering to the grinding surface of the grinding abrasive that rotates exists, and activates an alarm of this determination. In contrast, as depicted in FIG. 8, if pixels with a resin residual are adjacent across the rotation locus of the grinding abrasives in an oblique direction, one of the adjacent pixels does not consecutively adhere to the grinding surface of the grinding abrasive that rotates. Therefore, the second determining part 192 determines that a resin residual with such a size as to have an adverse effect does not exist.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A separating apparatus that separates a resin layer together with a film from a wafer to which the film is made to adhere with intermediary of the resin layer formed on one surface of the wafer and around which a protruding part is formed through protrusion of the film from a peripheral edge of the water while grasping the protruding part, the separating apparatus comprising:

holding means having a holding surface that holds the other surface of the wafer;

grasping means that grasps the protruding part of the wafer held by the holding means;

separating means that moves the grasping means relative to the holding means in a radial direction from the peripheral edge of the wafer toward a center to separate the resin layer from the one surface of the wafer;

an imaging unit that images the one surface of the wafer from which the resin layer has been separated;

a first determining part that determines whether or not a resin residual exists in at least one pixel of a captured image obtained by imaging by the imaging unit based on brightness of the one pixel; and a second determining part that determined whether or not the resin residual that adversely affects grinding exists from the captured image after the first determining part has determined whether or not the resin residual exists in each of the at least one pixel of the captured image, wherein the second determining part determines that the resin residual having an adverse effect in grinding exists when a ratio between an area obtained by summing up the at least one pixel about which the first determining part has determined that the resin residual exists and an area of the one surface of the wafer without the resin residual having an adverse effect is equal to or higher than a ratio set in advance.

2. A separating apparatus that separates a resin layer together with a film from a wafer to which the film is made to adhere with intermediary of the resin layer formed on one surface of the wafer and around which a protruding part is formed through protrusion of the film from a peripheral edge of the wafer while grasping the protruding part, the separating apparatus comprising:

holding means having a holding surface that holds the other surface of the wafer;

grasping means that grasps the protruding part of the wafer held by the holding means;

separating means that moves the grasping means relative to the holding means in a radial direction from the peripheral edge of the wafer toward a center to separate the resin layer from the one surface of the wafer;

an imaging unit that images the one surface of the wafer from which the resin layer has been separated;

a first determining part that determines whether or not a resin residual exists in at least one pixel of a captured image obtained by imaging by the imaging unit based on brightness of the one pixel; and a second determining part that determines whether or not the resin residual that adversely affects grinding exists from the captured image after the first determining part has determined whether or not the resin residual exists in each of the at least one pixel of the captured image, wherein the second determining part determines that the resin residual having an adverse effect in grinding exists if a pixel adjacent to the at least one pixel about which the first determining part has determined that the resin residual exists also has the resin residual.

* * * * *